(12) United States Patent
Wang et al.

(10) Patent No.: US 11,094,531 B2
(45) Date of Patent: Aug. 17, 2021

(54) SEMICONDUCTOR STRUCTURE AND METHOD FOR FORMING THE SAME

(71) Applicant: UNITED MICROELECTRONICS CORP., Hsinchu (TW)

(72) Inventors: Zhen-Zhen Wang, Singapore (SG); Jian-Jun Zhang, Singapore (SG)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/552,095

(22) Filed: Aug. 27, 2019

(65) Prior Publication Data

US 2020/0411311 A1 Dec. 31, 2020

(30) Foreign Application Priority Data

Jun. 26, 2019 (CN) .......................... 201910559598.0

(51) Int. Cl.
*H01L 21/02* (2006.01)
*H01L 21/768* (2006.01)
*H01L 29/40* (2006.01)
*H01L 29/423* (2006.01)

(52) U.S. Cl.
CPC .... *H01L 21/02129* (2013.01); *H01L 21/0217* (2013.01); *H01L 21/02274* (2013.01); *H01L 21/76802* (2013.01); *H01L 21/76877* (2013.01); *H01L 29/401* (2013.01); *H01L 29/42368* (2013.01)

(58) Field of Classification Search
CPC ......... H01L 21/02129; H01L 21/76802; H01L 21/76877; H01L 21/02274; H01L 21/0217; H01L 29/42368; H01L 29/401; H01L 23/5329–53295; H01L 21/76801–76837
See application file for complete search history.

(56) References Cited

U.S. PATENT DOCUMENTS

| | | | |
|---|---|---|---|
| 5,043,790 A | 8/1991 | Butler | |
| 6,013,584 A | 1/2000 | M'Saad | |
| 6,080,658 A * | 6/2000 | Huang | .............. H01L 21/31116 257/E21.252 |
| 6,251,791 B1 * | 6/2001 | Tsai | .................. H01L 21/31144 257/E21.252 |
| 7,791,158 B2 | 9/2010 | Jeong et al. | |

(Continued)

FOREIGN PATENT DOCUMENTS

| CN | 101417856 A | 4/2009 |
|---|---|---|
| CN | 102082091 B | 7/2012 |

(Continued)

OTHER PUBLICATIONS

Search report issued by EPO dated Sep. 11, 2020.

(Continued)

*Primary Examiner* — Shahed Ahmed
(74) *Attorney, Agent, or Firm* — WPAT, PC

(57) ABSTRACT

A semiconductor structure and a method for forming the same are provided. The semiconductor structure includes a substrate, a gate, and a phosphorus containing dielectric layer. The gate is on the substrate. The phosphorus containing dielectric layer is on the gate. The phosphorus containing dielectric layer has a varied phosphorus dopant density distribution profile.

10 Claims, 3 Drawing Sheets

(56) References Cited

U.S. PATENT DOCUMENTS

2003/0162353 A1* 8/2003 Park .................. H01L 27/10855
438/253
2003/0183898 A1 10/2003 Ohashi
2009/0261446 A1* 10/2009 Gogoi ............... H01L 21/82385
257/500

FOREIGN PATENT DOCUMENTS

CN 102592992 A 7/2012
CN 104078478 B 10/2017

OTHER PUBLICATIONS

Wu Jianrong, "Study on Mechanism of Special P Doped Distribution in HDP-CVD PSG Thin Films" Jun. 20, 2018, Shanghai Huahong Grace Semiconductor Manufacturing Corporation, Shanghai 201203, P. R. China.
Pohland, Oliver et al., "New Type of Dummy Layout Pattern to Control ILD etch Rate" Dec. 10, 2007, Proc. of SPIE vol. 6798.

* cited by examiner

SEMICONDUCTOR STRUCTURE AND METHOD FOR FORMING THE SAME

This application claims the benefit of People's Republic of China Patent Application No. 201910559598.0, filed Jun. 26, 2019, the subject matter of which is incorporated herein by reference.

BACKGROUND

Technical Field

The disclosure relates to a semiconductor structure and a method for forming the same, and particularly relates to a transistor and a method for forming the same.

Description of the Related Art

For forming a designed integrated circuit to a semiconductor wafer, a mask formed with a design layout pattern is provided. The layout pattern defined by the mask is transferred on to a photoresist layer on a surface of a semiconductor structure and then transferred into the semiconductor structure by photolithography processes. Therefore, the photolithography process is an important key for the semiconductor manufacturing.

The critical dimension (CD) of the pattern for the mask is limited to the resolution limit of the optical exposure tool. With the trend towards high integration and small pattern of the circuit design, the deviation or the distortion of the pattern transferred into the semiconductor structure occur more easily due to the optical proximity effect (OPE) during exposing the mask having high pattern density. The electrical characteristic of the device is affected by the distortion.

SUMMARY

Accordingly, the present invention provides a semiconductor structure and a method of forming the same.

According to a concept of the present disclosure, a method for forming a semiconductor structure is provided, which comprises the following steps. A gate is formed by a method comprising the following steps. A gate dielectric layer is formed on a substrate. A gate electrode is formed on the gate dielectric layer. A nitride spacer is formed on a sidewall of the gate electrode. A phosphorus containing dielectric layer is formed on the gate. The phosphorus containing dielectric layer has a varied phosphorus dopant density distribution profile.

According to a concept of the present disclosure, a semiconductor structure is provided. The semiconductor structure comprises a substrate, a gate, and a phosphorus containing dielectric layer. The gate is on the substrate. The phosphorus containing dielectric layer is on the gate. The phosphorus containing dielectric layer has a varied phosphorus dopant density distribution profile.

According to a concept of the present disclosure, a semiconductor structure is provided, which is formed by a method comprising the following steps. A gate is formed by a method comprising the following steps. A gate dielectric layer is formed on a substrate. A gate electrode is formed on the gate dielectric layer. A nitride spacer is formed on a sidewall of the gate electrode. A phosphorus containing dielectric layer is formed on the gate. The phosphorus containing dielectric layer has a varied phosphorus dopant density distribution profile.

Figure 1:
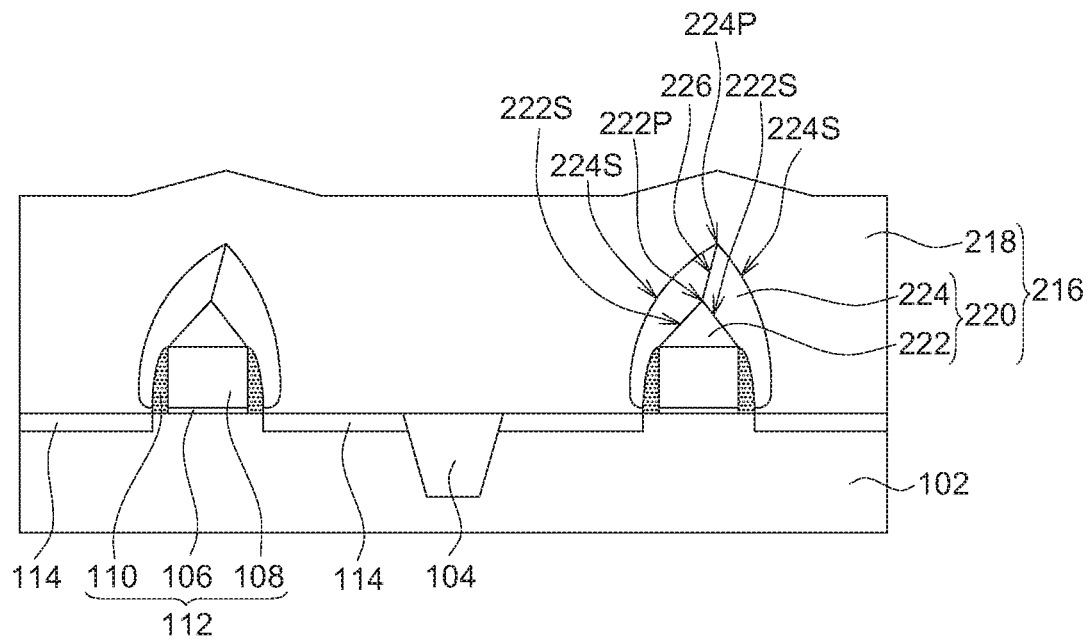
FIG. 1 illustrates a method for forming a semiconductor structure according to an embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Embodiments are provided hereinafter with reference to the accompanying drawings for describing the related procedures and configurations. It is noted that not all embodiments of the invention are shown. Also, it is noted that there may be other embodiments of the present disclosure which are not specifically illustrated. Modifications and variations can be made without departing from the spirit of the disclosure to meet the requirements of the practical applications. It is also important to point out that the illustrations may not be necessarily be drawn to scale. Thus, the specification and the drawings are to be regard as an illustrative sense rather than a restrictive sense. The identical and/or similar elements of the embodiments are designated with the same and/or similar reference numerals.

Please refer to FIG. 1, which illustrates a method for forming a semiconductor structure according to an embodiment. A substrate 102 is provided. The substrate 102 may comprise a silicon containing substrate or other suitable semiconductor substrates. An isolation element 104 may be formed in the substrate 102 so as to define different active regions in the substrate 102. One of the two active regions as shown in FIG. 1 is a P-type device region, and the other of the two active regions is an N-type device region, for example. The isolation element 104 may comprise a shallow trench isolation structure, but is not limited thereto. The isolation element 104 may use other suitable isolation structures. A gate dielectric layer 106 may be formed on the substrate 102. The gate dielectric layer 106 may comprise an oxide (such as silicon oxide), a nitride (such as silicon nitride (SiN)), or other suitable dielectric materials. A gate electrode 108 is formed on the gate dielectric layer 106. The gate electrode 108 may comprise polysilicon, amorphous silicon, or other suitable materials having conductivity. The gate dielectric layer 106 and the gate electrode 108 may be formed by forming a blanket film (not shown) by using a suitable deposition process, and then patterning the film by using a photolithography process and an etching process. The deposition process may comprise a chemical vapor deposition method, a physical vapor deposition method, and so on, but is not limited thereto. The deposition process may use other suitable deposition methods. A nitride spacer 110 may be formed on a sidewall of the gate electrode 108 and a sidewall of the gate dielectric layer 106. The nitride spacer 110 may be formed by a method comprising a suitable deposition process to form a blanket film (not shown), and then an anisotropic etching process performed to the film. The remained portion of the film on the sidewall of the gate electrode 108 and the sidewall of the gate dielectric layer 106 from the etching process forms the nitride spacer 110. The deposition process may comprise a chemical vapor deposition method, a physical vapor deposition method, and so on, but is not limited thereto. The deposition process may use other suitable deposition methods. The nitride spacer 110 may have a width gradually increased from a top to a bottom of the nitride spacer 110. The nitride spacer 110 comprises silicon nitride (SiN). The etching process may comprise a dry etching method, a wet etching method, or other suitable etching methods. A gate 112 may comprise the gate dielectric layer 106, the gate electrode 108 and the nitride spacer 110. A source/drain 114 is formed in the substrate 102. The source/drain 114 may be formed by doping the substrate 102. A transistor may comprise the gate 112 and the source/drain 114. The gate electrode 108 and the source/drain 114 may comprise a metal silicide formed by a metal silicidation on a top portion of the gate electrode 108 and the source/drain 114.

Referring to FIG. 1, a phosphorus containing dielectric layer 216 is formed on the gate 112, the source/drain 114 and the isolation element 104. In embodiments, the phosphorus containing dielectric layer 216 may be formed by a method comprising a high density plasma chemical vapor deposition (HDPCVD), a sub-atmosphere chemical vapor deposition (SACVD), or other suitable methods. The phosphorus containing dielectric layer 216 may comprise phosphosilicate glass (PSG), borophosphosilicate glass (BPSG), or other suitable phosphorus containing dielectric materials. A phosphorus content of the phosphorus containing dielectric layer 216 may be about 6 wt %-12 wt %, or may be higher than 12 wt %. In an embodiment, the phosphorus content of the phosphorus containing dielectric layer 216 may be about 9 wt %.

In embodiments, the phosphorus containing dielectric layer 216 has a varied phosphorus dopant density distribution profile. In particular, the phosphorus containing dielectric layer 216 comprises a film portion 218 and flame-like distribution profile portions 220. The flame-like distribution profile portions 220 correspond to the gates 112. The flame-like distribution profile portion 220 comprises a phosphorus dopant density region 222 and a phosphorus dopant density region 224. The phosphorus dopant density region 222 (first phosphorus dopant density region) is on an upper surface of the gate electrode 108. The phosphorus dopant density region 222 may have a width gradually decreased from a bottom portion to a top portion of the phosphorus dopant density region 222. The phosphorus dopant density region 222 may have two opposing plane sidewall surfaces 222S. In an embodiment, the phosphorus dopant density region 222 may have a triangle-like shape having a top point 222P defined between the sidewall surfaces 222S. The phosphorus dopant density region 224 (second phosphorus dopant density region) may be on the sidewall surfaces 222S of the phosphorus dopant density region 222. The phosphorus dopant density region 224 may be also on the sidewall surfaces of the nitride spacers 110. The phosphorus dopant density region 224 may have two opposing convex sidewall surfaces 224S. A top point 224P may be defined between the sidewall surfaces 224S. The flame-like distribution profile portion 220 may have an asymmetric shape. For example, a straight line 226 defined between the top point 222P of the phosphorus dopant density region 222 and the top point 224P of the phosphorus dopant density region 224 may be deviated from a vertical direction which may be a direction perpendicular to an upper surface of the substrate 102. The film portion 218 of the phosphorus containing dielectric layer 216 is on the flame-like distribution profile portion 220, the source/drain 114 and the isolation element 104.

In an embodiment, a phosphorus dopant density of the phosphorus dopant density region 222 is larger than a phosphorus dopant density of the phosphorus dopant density region 224. A phosphorus dopant density of the film portion 218 is larger than the phosphorus dopant density of the phosphorus dopant density region 224. The phosphorus dopant density of the phosphorus dopant density region 222 may be identical to the phosphorus dopant density of the film portion 218 substantially. For example, both of a phosphorus content of the phosphorus dopant density region 222 and a phosphorus content of the film portion 218 may be 9%. A phosphorus content of the phosphorus dopant density region 224 may be less than the phosphorus contents of the phosphorus dopant density region 222 and the film portion 218 by 0.3 wt %-1 wt %. In other words, the phosphorus content of the phosphorus dopant density region 224 may be 8 wt %-8.7 wt %.

In another embodiment, the phosphorus dopant density of the phosphorus dopant density region 222 may be substantially identical to the phosphorus dopant density of the phosphorus dopant density region 224. The phosphorus dopant density of the film portion 218 may be larger than the phosphorus dopant density of the phosphorus dopant density region 222, and larger than the phosphorus dopant density of the phosphorus dopant density region 224. For example, the phosphorus content of the film portion 218 may be 9%. The phosphorus contents of the phosphorus dopant density region 222 and the phosphorus dopant density region 224 may be less than the phosphorus content of the film portion 218 by 0.3 wt %-1 wt %. In other words, the phosphorus content of the phosphorus dopant density region 222 may be 8 wt %-8.7 wt %. In addition, the phosphorus content of the phosphorus dopant density region 224 may be 8 wt %-8.7 wt %.

In an embodiment, the phosphorus containing dielectric layer 216 as shown in FIG. 1 may be an initial film layer formed through a high density plasma chemical vapor deposition (HDPCVD) process. In an embodiment, the high density plasma chemical vapor deposition (HDPCVD) may use the following process parameters, for example. A low frequency (LF) power may be 3000 W-4000 W. A high frequency (HF) power may be 1500 W-2500 W. A helium (He) gas flow is 100 sccm-200 sccm. An oxygen ($O_2$) gas flow is 400 sccm-800 sccm. A phosphine ($PH_3$) gas flow is 100 sccm-180 sccm. A silane ($SiH_4$) gas flow is 20 sccm-100 sccm. In an embodiment, a gas content ratio of phosphine: silane in a reaction chamber is 1:1. A pressure in the reaction chamber is 0.2 Torr-1 Torr. A temperature (such as a temperature of a substrate or a temperature of a stage for the substrate placed thereon) may be 200° C.-650° C. A deposition thickness is set as 6000 Å-10000 Å. A depositing rate is set as 5500 Å/min-6500 Å/min. A sputtering rate is 700 Å/min-1000 Å/min. A phosphorus content of the deposited film is 6 wt %-12 wt %. In an embodiment, the film portion 218, the phosphorus dopant density region 222 and the phosphorus dopant density region 224 all are phosphosilicate glass (PSG), or are borophosphosilicate glass (BPSG), but the present disclosure is not limited thereto.

Figure 1A:
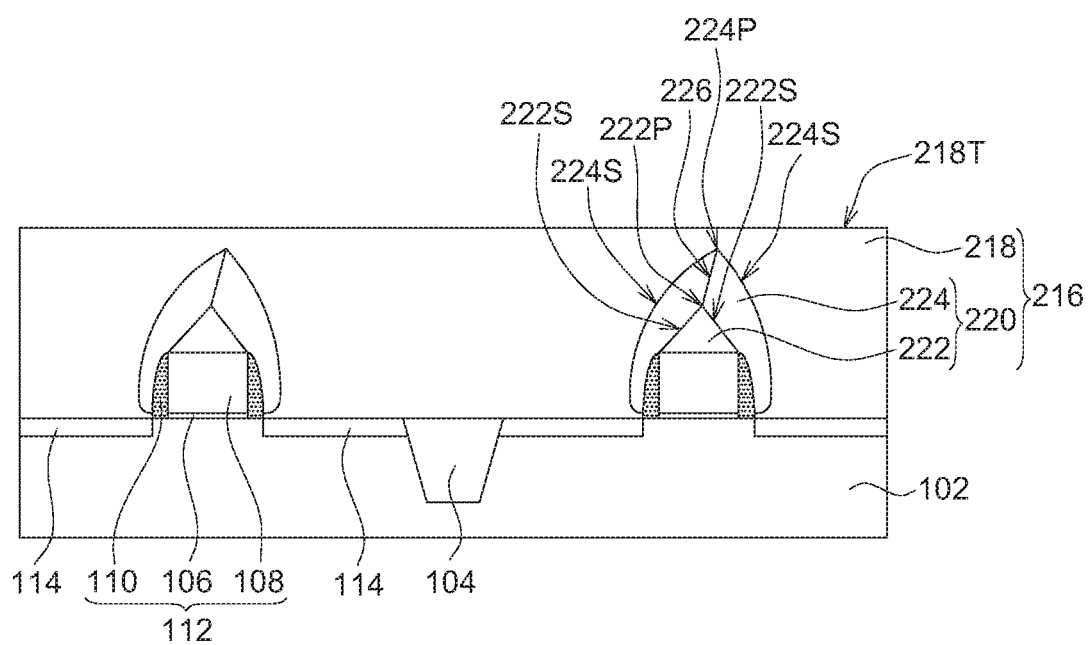
FIG. 1A illustrates a method for forming a semiconductor structure according to an embodiment.

In another embodiment, as shown in FIG. 1A, the semiconductor structure has the film portion 218 having a flat upper surface 218T.

Figure 1B:
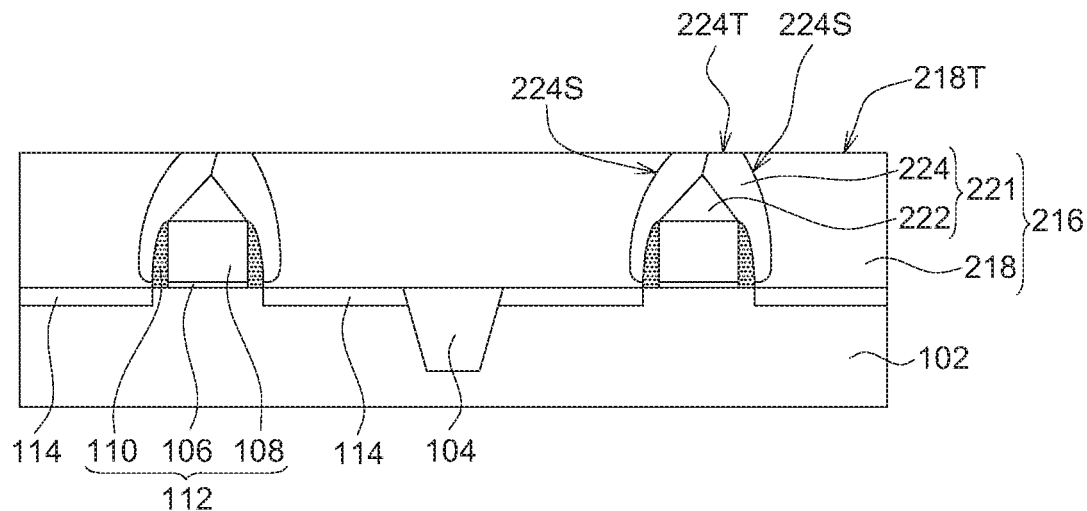
FIG. 1B illustrates a method for forming a semiconductor structure according to an embodiment.
Figure 1C:
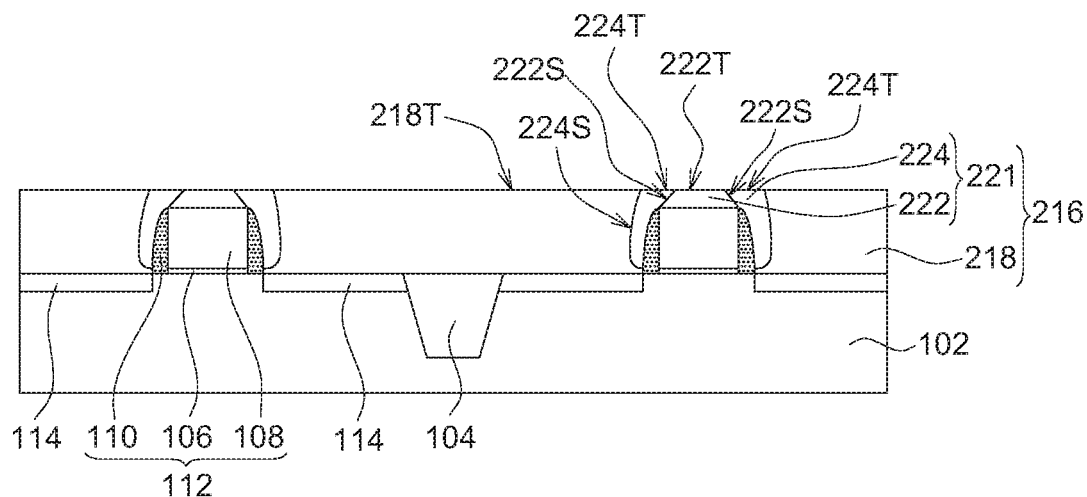
FIG. 1C illustrates a method for forming a semiconductor structure according to an embodiment.

In yet another embodiment, as shown in FIG. 1B, the semiconductor structure has the phosphorus containing dielectric layer 216 having the phosphorus dopant density region 224 having a flat upper surface 224T. In this embodiment, the phosphorus containing dielectric layer 216 comprises the film portion 218 and the bud-like distribution profile portions 221. The bud-like distribution profile portions 221 correspond to the gates 112. The bud-like distribution profile portion 221 comprises the phosphorus dopant density region 222 and the phosphorus dopant density region 224. The phosphorus dopant density region 224 of the bud-like distribution profile portion 221 may have the two opposing convex sidewall surfaces 224S, and the upper surface 224T between the sidewall surfaces 224S. The upper surface 224T of the phosphorus dopant density region 224 may be substantially flush with the upper surface 218T of the film portion 218.

In more yet another embodiment, as shown in FIG. 10, the semiconductor structure has the phosphorus containing dielectric layer 216 having the phosphorus dopant density region 222 having a flat upper surface 222T. In this embodiment, the phosphorus containing dielectric layer 216 comprises the film portion 218 and the bud-like distribution profile portions 221 corresponding to the gates 112. The bud-like distribution profile portion 221 comprises the phosphorus dopant density region 222 and the phosphorus dopant density regions 224. The phosphorus dopant density region 222 of the bud-like distribution profile portion 221 may have two opposing plane sidewall surfaces 222S, and the upper surface 222T between the sidewall surfaces 222S. The phosphorus dopant density regions 224 of the bud-like distribution profile portion 221 may have the two opposing convex sidewall surfaces 224S, and the upper surface 224T. The upper surface 224T of the phosphorus dopant density region 224 is between the sidewall surface 224S and the sidewall surface 222S of the phosphorus dopant density region 222. The upper surface 222T of the phosphorus dopant density region 222 may be substantially flush with the upper surface 224T of the phosphorus dopant density region 224, and flush with the upper surface 218T of the film portion 218.

The phosphorus containing dielectric layers 216 of the semiconductor structures as shown in FIG. 1A, FIG. 1B and FIG. 10 may be formed with an etching process or a chemical mechanical polishing performed to flatten the upper surface of the phosphorus containing dielectric layer 216, accompanying with the high density plasma chemical vapor deposition (HDPCVD) process.

In embodiments, the semiconductor structure may be formed by a method comprising an etching step performed to the phosphorus containing dielectric layer 216. In an embodiment, the etching step for removing the phosphorus containing dielectric layer 216 (such as PSG or BPSG) has a high etch selectivity relative to a nitride material (such as SiN). In other words, the etching step for removing the phosphorus containing dielectric layer 216 has an etching rate to the phosphorus containing dielectric layer 216 significantly faster than an etching rate to the nitride material. Or even, the nitride material exposed in an etching ambient of the etching step for removing the phosphorus containing dielectric layer 216 is substantially removed by the etching step. The phosphorus containing dielectric layer 216 can also achieve the demand of sufficient filling in an empty gap between the gates 112. The phosphorus containing dielectric layer 216 may be used as an inter-layer dielectric layer.

Figure 2:
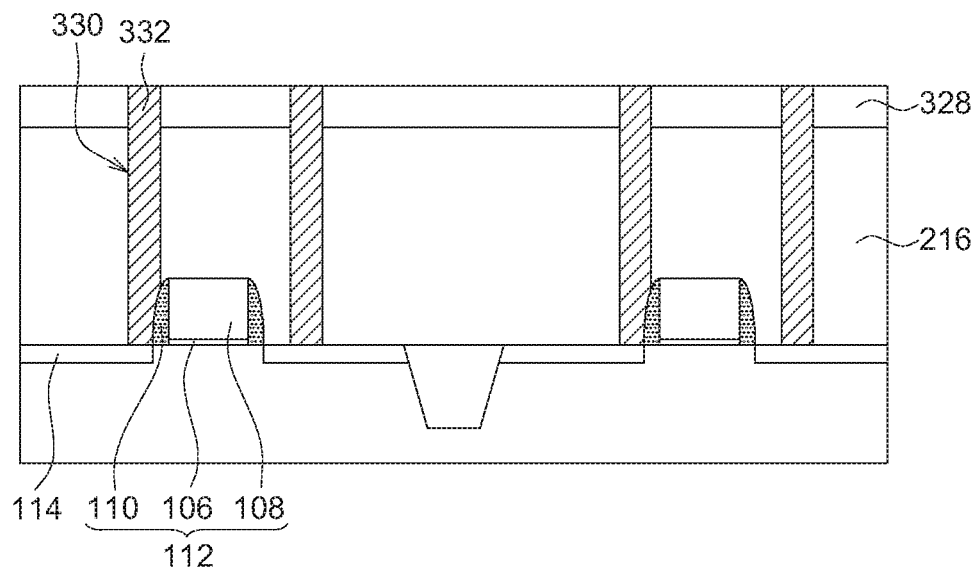
FIG. 2 illustrates a method for forming a semiconductor structure according to an embodiment.

Please refer to FIG. 2, which illustrates a method for forming a semiconductor structure according to an embodiment. The phosphorus containing dielectric layer 216 may be formed by the method illustrated with referring to FIG. 1, FIG. 1A, FIG. 1B, or FIG. 1C. A cap layer 328 may be formed on the phosphorus containing dielectric layer 216. The cap layer 328 may comprise TEOS, but is not limited thereto. The cap layer 328 may use other suitable materials. The cap layer 328 may be formed by a chemical vapor deposition method, a physical vapor deposition method, or other suitable methods. The cap layer 328 may be used as an inter-layer dielectric layer.

An etching step may be performed to remove portions of the cap layer 328 and the phosphorus containing dielectric layer 216 so as to form a contact opening 330 exposing the source/drain 114. The etching step may comprise a dry etching, a wet etching, or other suitable etching process methods. In addition, a contact element 332 (such as a contact via for the source/drain 114) is formed to fill in the contact opening 330. The contact element 332 may comprise a metal such as Al, W, etc., or other suitable conductive materials. The contact element 332 may be formed by a method comprising a physical vapor deposition, a chemical vapor deposition, or other suitable methods.

In an embodiment, for example, the contact opening 330 may be formed by a method comprising the following steps. A photolithography process is used to transfer a pattern of a photomask into a photoresist layer (not shown) formed on the cap layer 328. An etching process is performed to transfer the pattern of the photoresist layer down into the cap layer 328 and the phosphorus containing dielectric layer 216 so as to form the contact opening 330. Then, the photoresist layer may be removed.

In an embodiment, the pattern transferring in the photolithography process for forming the contact opening 330 may has a shift from an expected position, which results in the contact opening 330 in a shift position toward the gate 112, or even exposing the nitride spacer 110. That is, the nitride spacer 110 may be exposed to the etching process for removing the phosphorus containing dielectric layer 216. In embodiments, the etching step for forming the contact opening 330 has high etch selectivity to the phosphorus containing dielectric layer 216 formed by the method illustrated with referring to FIG. 1. Therefore, if the nitride spacer 110 (such as silicon nitride (SiN)) is exposed in the etching ambient, the nitride spacer 110 will not be etched away through the etching process, and even will be functioned as an etching mask for the etching process. In other words, the contact opening 330/the contact element 332 may be formed by a self-aligned method. As such, a short problem between the contact element 332 and the gate 112 (such as the gate electrode 108) can be avoided, and a process window can be improved.

Figure 3:
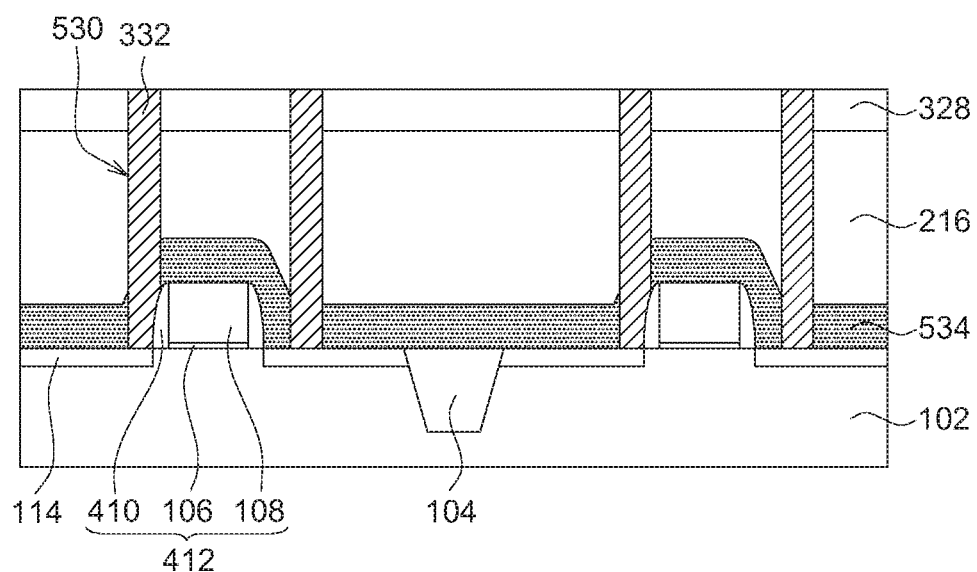
FIG. 3 illustrates a method for forming a semiconductor structure according to an embodiment.

Please refer to FIG. 3, which illustrates a method for forming a semiconductor structure according to an embodiment. A spacer 410 may be formed on the sidewalls of the gate dielectric layer 106 and the gate electrode 108. A gate 412 may comprise the gate dielectric layer 106, the gate electrode 108 and the spacer 410. A transistor may comprise the gate 412 and the source/drain 114 formed in the substrate 102. A nitride inter-layer dielectric layer 534 may be formed to cover the gate 412 and the isolation element 104 formed in the substrate 102. The nitride inter-layer dielectric layer 534 may be formed by a chemical vapor deposition method, a physical vapor deposition method, or other suitable methods. In an embodiment, the nitride inter-layer dielectric layer 534 may be a conformal film on the gate 412 and the isolation element 104. The phosphorus containing dielectric layer 216 may be formed on the nitride inter-layer dielectric layer 534. The phosphorus containing dielectric layer 216 can also achieve the demand of sufficient filling in an empty gap between the raised portions of the nitride inter-layer dielectric layer 534 (i.e. the corresponding portions of the nitride inter-layer dielectric layer 534 on/over the gates 412). The cap layer 328 may be formed on the phosphorus containing dielectric layer 216.

An etching step may be performed to remove portions of the cap layer 328, the phosphorus containing dielectric layer 216 and the nitride inter-layer dielectric layer 534 so as to form a contact opening 530 exposing the source/drain 114. The etching step may comprise a dry etching, a wet etching, or other suitable etching process. In addition, the contact element 332 (such as a contact via for the source/drain) filling in contact opening 530 may be formed.

In an embodiment, for example, the contact opening 530 as shown in FIG. 3 may be formed by a method comprising the following steps. A photolithography process is used to transfer a pattern of a photomask into a photoresist layer (not shown) formed on the cap layer 328. An etching process is performed to transfer the pattern of the photoresist layer down into the cap layer 328, the phosphorus containing dielectric layer 216 and the nitride inter-layer dielectric layer 534 in order so as to form the contact opening 530.

In an embodiment, the etching process for forming the contact opening 530 may use different etching steps performed individually. Specifically, for example, a first etching step may be performed firstly to remove the portions of the cap layer 328 and the phosphorus containing dielectric layer 216. Then, a second etching step may be performed to remove the portion of the nitride inter-layer dielectric layer 534. The first etching step may be different from the second etching step. The first etching step may have a high etch selectivity to the phosphorus containing dielectric layer 216, and thus may stop on the nitride inter-layer dielectric layer 534 (such as silicon nitride (SiN)). Then, the second etching step may be selected based on aiming for removing the nitride inter-layer dielectric layer 534, and thus may apply an etchant, an etching parameter, or/and an etching method, different from those of the first etching step properly. The second etching step may use the patterned phosphorus containing dielectric layer 216/cap layer 328 as an etching mask.

In an embodiment, the pattern transferring in the photolithography process for forming the contact opening 530 may has a shift from an expected position, which results in the contact opening 530 in a shift position toward the gate 412, or even exposing the spacer 410. That is, the spacer 410 may be exposed to the etching process (e.g. the second etching step) for removing the nitride inter-layer dielectric layer 534. In an embodiment, the second etching step has high etch selectivity to the nitride inter-layer dielectric layer 534, and etches substantially none of the spacer 410 having a material different from the nitride inter-layer dielectric layer 534. For example, the spacer 410 comprises an oxide such as silicon oxide, or other suitable materials. Therefore, if the spacer 410 is exposed in the etching ambient, the spacer 410 will not be etched away through the etching process, and even will be functioned as an etching mask for the second etching step. In other words, the contact opening 530/the contact element 332 may be formed by a self-aligned method. As such, a short problem between the contact element 332 and the gate 412 (such as the gate electrode 108) can be avoided, and a process window can be improved.

Accordingly, the method for forming the semiconductor structure in the present disclosure can form the contact opening/contact element by a self-aligned method. Therefore, a short problem between the contact element and the gate can be avoided, and a process window can be improved.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for forming a semiconductor structure, comprising:
    forming a gate by a method comprising:
    forming a gate dielectric layer on a substrate;
    forming a gate electrode on the gate dielectric layer; and
    forming a nitride spacer on a sidewall of the gate electrode; and
    forming a phosphorus containing dielectric layer on the gate, wherein the phosphorus containing dielectric layer has a varied phosphorus dopant density distribution profile, the phosphorus containing dielectric layer comprises a bud-like distribution profile portion, the bud-like distribution profile portion comprises:
    a first phosphorus dopant density region on the gate, and having two opposing plane sidewall surfaces; and
    a second phosphorus dopant density region on the first phosphorus dopant density region, and having two opposing convex sidewall surfaces and a flat upper surface.

2. The method for forming the semiconductor structure according to claim 1, wherein the phosphorus containing dielectric layer has a plurality of the bud-like distribution profile portions respectively corresponding to a plurality of the gates.

3. The method for forming the semiconductor structure according to claim 1, further comprising performing an etching step having etch selectivity to the phosphorus containing dielectric layer.

4. The method for forming the semiconductor structure according to claim 3, comprising forming a contact opening in the phosphorus containing dielectric layer by the etching step.

5. The method for forming the semiconductor structure according to claim 1, wherein the phosphorus containing dielectric layer comprises phosphosilicate glass (PSG) or borophosphosilicate glass (BPSG), and the nitride spacer comprises silicon nitride (SiN).

6. The method for forming the semiconductor structure according to claim 1, wherein the nitride spacer has a width gradually increased from a top to a bottom of the nitride spacer.

7. The method for forming the semiconductor structure according to claim 1, wherein the phosphorus containing dielectric layer is formed by a method comprising a high density plasma chemical vapor deposition (HDPCVD).

8. The method for forming the semiconductor structure according to claim 7, wherein the high density plasma chemical vapor deposition has process parameters comprising:
   a depositing rate of 5500 Å/min-6500 Å/min; and
   a sputtering rate of 700 Å/min-1000 Å/min.

9. The method for forming the semiconductor structure according to claim 1, wherein
   the first phosphorus dopant density region has a flat upper surface.

10. A semiconductor structure, which is formed by the method according to claim 1.

* * * * *